United States Patent
Yu et al.

(10) Patent No.: US 8,987,085 B2
(45) Date of Patent: Mar. 24, 2015

(54) METHODS FOR IMPROVING UNIFORMITY OF CAP LAYERS

(75) Inventors: Chen-Hua Yu, Hsin-Chu (TW); Ming-Shih Yeh, Chupei (TW); Chih-Hsien Lin, Tainan (TW); Yung-Cheng Lu, Taipei (TW); Hui-Lin Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1050 days.

(21) Appl. No.: 11/524,000

(22) Filed: Sep. 20, 2006

(65) Prior Publication Data

US 2008/0032472 A1 Feb. 7, 2008

Related U.S. Application Data

(60) Provisional application No. 60/834,626, filed on Aug. 1, 2006.

(51) Int. Cl.
*H01L 21/768* (2006.01)
*H01L 21/02* (2006.01)
*H01L 21/3105* (2006.01)

(52) U.S. Cl.
CPC .... *H01L 21/76849* (2013.01); *H01L 21/02074* (2013.01); *H01L 21/3105* (2013.01); *H01L 21/76826* (2013.01)

USPC ............................................. 438/250

(58) Field of Classification Search
CPC .......... H01L 21/76814; H01L 21/02074; H01L 21/3105; H01L 21/76826; H01L 21/02063
USPC ............................................. 438/250
See application file for complete search history.

(56) References Cited

U.S. PATENT DOCUMENTS

| | | | | |
|---|---|---|---|---|
| 5,674,787 A | * | 10/1997 | Zhao et al. | 438/627 |
| 6,797,627 B1 | * | 9/2004 | Shih et al. | 438/694 |
| 6,989,601 B1 | * | 1/2006 | van Ngo et al. | 257/762 |
| 2005/0009325 A1 | * | 1/2005 | Chung et al. | 438/637 |
| 2005/0085082 A1 | * | 4/2005 | Dougan et al. | 438/704 |
| 2005/0136185 A1 | * | 6/2005 | Ramanathan et al. | 427/299 |
| 2006/0252252 A1 | * | 11/2006 | Zhu et al. | 438/618 |

* cited by examiner

*Primary Examiner* — Tony Tran
(74) *Attorney, Agent, or Firm* — Slater & Matsil, L.L.P.

(57) ABSTRACT

A method of forming an integrated circuit includes providing a semiconductor substrate, forming a metallization layer over the semiconductor substrate, wherein the metallization layer comprises a metal feature in a low-k dielectric layer and extending from a top surface of the low-k dielectric layer into the low-k dielectric layer, performing a treatment to the low-k dielectric layer to form a hydrophilic top surface, and plating a cap layer on the metal feature in a solution.

19 Claims, 5 Drawing Sheets

METHODS FOR IMPROVING UNIFORMITY OF CAP LAYERS

This application claims the benefit of U.S. Provisional Application Ser. No. 60/834,626, filed on Aug. 1, 2006, entitled "Methods for Improving Uniformity of Cap Layers," which application is hereby incorporated herein by reference.

TECHNICAL FIELD

This invention relates generally to integrated circuits, and more particularly to the formation methods of interconnect structures.

BACKGROUND

A conventional integrated circuit contains a plurality of patterns of metal lines separated by inter-wiring spacings, and a plurality of interconnect lines, such as bus lines, bit lines, word lines, and logic interconnect lines. Typically, the metal patterns of vertically spaced metallization layers are electrically interconnected by vias. Metal lines formed in trench-like openings typically extend substantially parallel to the semiconductor substrate. Semiconductor devices of this type, according to current technology, may comprise eight or more levels of metallization to satisfy device geometry and micro-miniaturization requirements.

A common method for forming metal lines is known as "damascene". Generally, this process involves forming an opening in the dielectric interlayer, which separates the vertically-spaced metallization layers. The opening is typically formed using conventional lithographic and etching techniques. After an opening is formed, the opening is filled with copper or copper alloys to form a metal line and/or a via. Excess metal material on the surface of the dielectric interlayer is then removed by chemical mechanical polish (CMP).

Although copper has low resistivity and high reliability, it suffers from electro-migration (EM) and stress-migration (SM) reliability issues as geometries continue to shrink and current densities increase. Various approaches are thus explored to solve these problems.

One of the solutions for solving the above-discussed problem is to form a metal cap on the copper. The formation of metal caps greatly improves the reliability of the integrated circuit by reducing the surface migration of the copper lines. It has been found that under stressed conditions, the mean time to failure (MTTF) of the illustrated interconnection structure may be ten times longer than that of an interconnect structure having no metal caps. Part of the reason for the improvement is the reduction of electro-migration. With the metal caps, stress-induced void formation is also significantly reduced.

Metal caps are typically formed using electroless plating, during which the semiconductor wafer, on which the copper lines are formed, is submerged into a metal-ion-containing solution. Metal ions in the solution are selectively deposited on copper, and thus a metal cap is formed on the copper line, but not on the low-k dielectric layer in which the copper line is formed. A problem for this method is that it is difficult to control the thickness uniformity of the metal cap, and sometimes the metal cap cannot cover the entire surface of the copper line well. A method for improving the plating process is thus needed.

SUMMARY OF THE INVENTION

In accordance with one aspect of the present invention, a method of forming an integrated circuit includes providing a semiconductor substrate, forming a metallization layer over the semiconductor substrate, wherein the metallization layer comprises a metal feature in a low-k dielectric layer and extending from a top surface of the low-k dielectric layer into the low-k dielectric layer, performing a treatment to the low-k dielectric layer to form a hydrophilic top surface, and plating a cap layer on the metal feature in a solution.

In accordance with another aspect of the present invention, a method of forming an integrated circuit includes providing a semiconductor substrate, forming a low-k dielectric layer over the semiconductor substrate, forming an opening extending from a top surface of the low-k dielectric layer into the low-k dielectric layer, filling a metal into the opening, performing a chemical mechanical polish to remove portions of the metal over a top surface of the low-k dielectric layer, performing a treatment to convert a top surface of the low-k dielectric layer from hydrophobic to hydrophilic, and selectively plating a metal cap on the metal-filled opening.

In accordance with yet another aspect of the present invention, a method of forming an integrated circuit includes providing a semiconductor substrate, forming a low-k dielectric layer over the semiconductor substrate, forming an opening extending from a first top surface of the low-k dielectric layer into the low-k dielectric layer, filling a metal into the opening, performing a chemical mechanical polish to remove portions of the metal over the first top surface of the low-k dielectric layer, performing a first plasma treatment to convert a second top surface over the low-k dielectric layer from hydrophobic to hydrophilic using an oxygen-containing gas, performing a second plasma treatment to reduce a metal oxide formed during the first plasma treatment using a hydrogen-containing gas, and electroless-plating a metal cap on the metal-filled opening.

An advantageous feature of the present invention is that, by converting the top surface of the low-k dielectric from hydrophobic to hydrophilic, its wetting ability is improved. The improved contact between the low-k dielectric layer and the plating solution improves the contact between copper lines and the plating solution, and thus the thickness uniformity of the metal cap is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
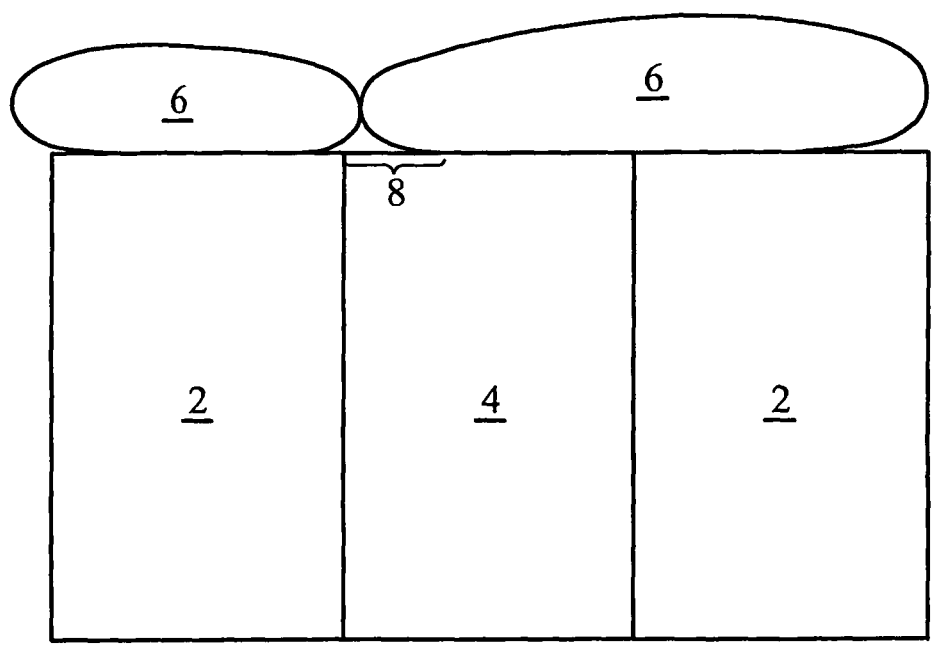
FIG. 1 schematically illustrates a surface condition during an electroless-plating, wherein a cap layer is to be formed on a copper line.

FIG. 1 schematically illustrates a surface condition during an electroless-plating, wherein a cap layer is to be formed on a copper line 4, which is in turn formed in a low-k dielectric layer 2. Plating solution 6 is in contact with copper line 4 and low-k dielectric layer 2. Due to the hydrophobic behavior of low-k dielectric layer 2, portions of the surface of low-k dielectric layer 2 are not in good contact with plating solution 6. Conventionally, the thickness uniformity of a plated metal cap (not shown) is not satisfactory. It has been found that the hydrophobic surface of low-k dielectric layer 2 is one of the causes of the non-uniformity problem. Due to the surface tension of plating solution 6, some of the surface regions of copper line 4, for example, surface region 8, may be out of contact with plating solution 6. As a result, the uniformity in the thickness of the resulting cap is adversely affected.

Based on the findings discussed in the preceding paragraph, the embodiments of the present invention are provided to improve the wetting ability of the surface of the low-k dielectric layers. Accordingly, the uniformity of cap layers on metal lines is improved. The intermediate stages of manufacturing an embodiment of the present invention are illustrated in FIGS. 2 through 5B. Throughout the various views and illustrative embodiments of the present invention, like reference numbers are used to designate like elements.

Figure 2:
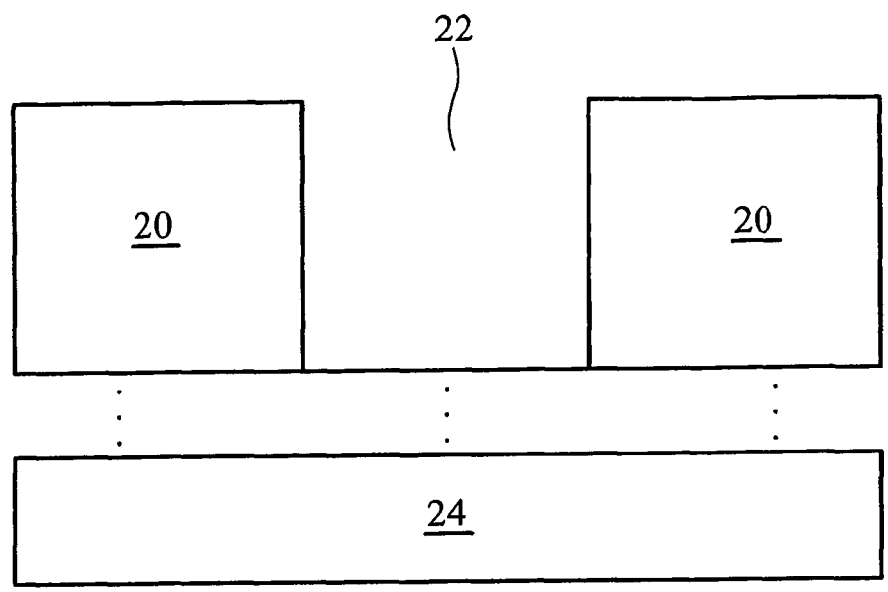
FIGS. 2 through 5B are cross-sectional views of intermediate stages in the manufacture of a first embodiment of the present invention.

FIG. 2 illustrates the formation of a trench 22 in a low-k dielectric layer 20, which is further formed over a semiconductor substrate 24. Substrate 24 may comprise commonly used semiconductor materials such as silicon, SiGe, and the like, and has integrated circuits formed therein. In the preferred embodiment, low-k dielectric layer 20 is an inter-metal dielectric (IMD) layer, preferably with a dielectric constant (k value) lower than about 3.5. Furthermore, the k value of low-k dielectric layer 20 may be lower than about 2.5 (hence low-k dielectric layer 20 is referred to as an extremely low-k dielectric layer). Low-k dielectric layer 20 preferably contains nitrogen, carbon, hydrogen, oxygen, fluorine, and combinations thereof. Low-k dielectric layer 20 may have carbon and hydrogen containing terminals, such as $CH_3$ terminals, and the exemplary materials of low-k dielectric layer 20 include SiCO, SiCF, $SiCH_x$, and the like. These materials tend to be hydrophobic, and thus have difficulty achieving uniform contact with plating solutions during the subsequent plating processes.

Figure 3:
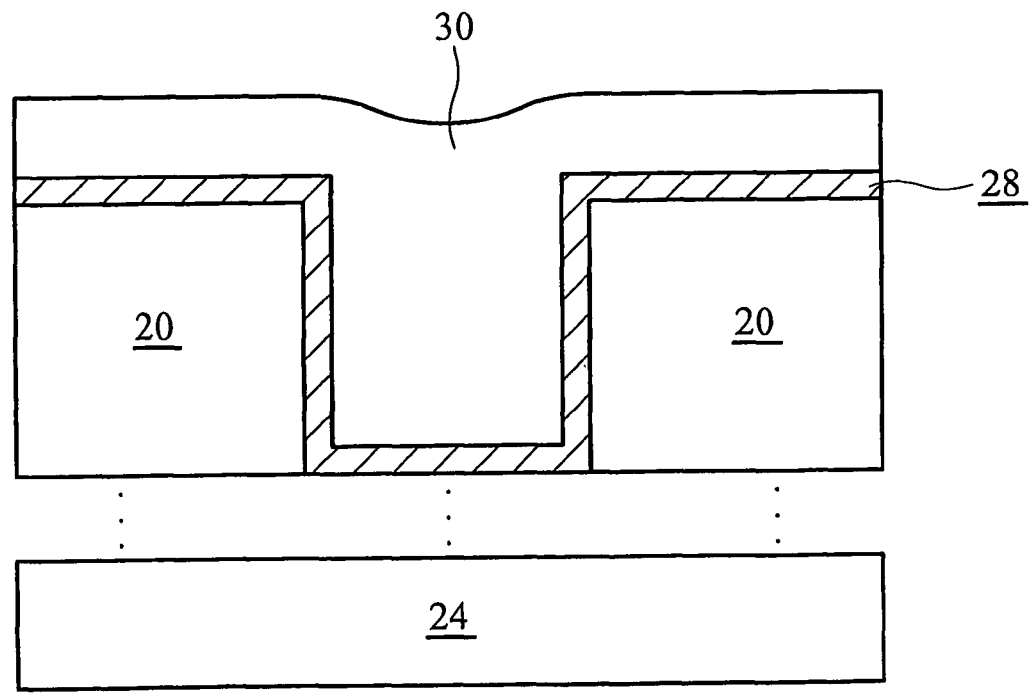

Referring to FIG. 3, a blanket diffusion barrier layer 28 is formed to cover the sidewalls and bottom of trench 22. Diffusion barrier layer 28 is preferably formed of a material comprising titanium, titanium nitride, tantalum, tantalum nitride, ruthenium, ruthenium nitride, titanium compound, tantalum compound, and combinations thereof. The preferred formation methods include physical vapor deposition (PVD), atomic layer deposition (ALD), and other commonly used methods.

A seed layer (not shown), which preferably includes copper or copper alloys, is formed on diffusion barrier layer 28. A conductive material 30 is then filled into trench 22, preferably by plating. Conductive material 30 preferably comprises copper or copper alloys, although other materials such as aluminum, tungsten, silver, and combinations thereof, can also be used.

Figure 4:
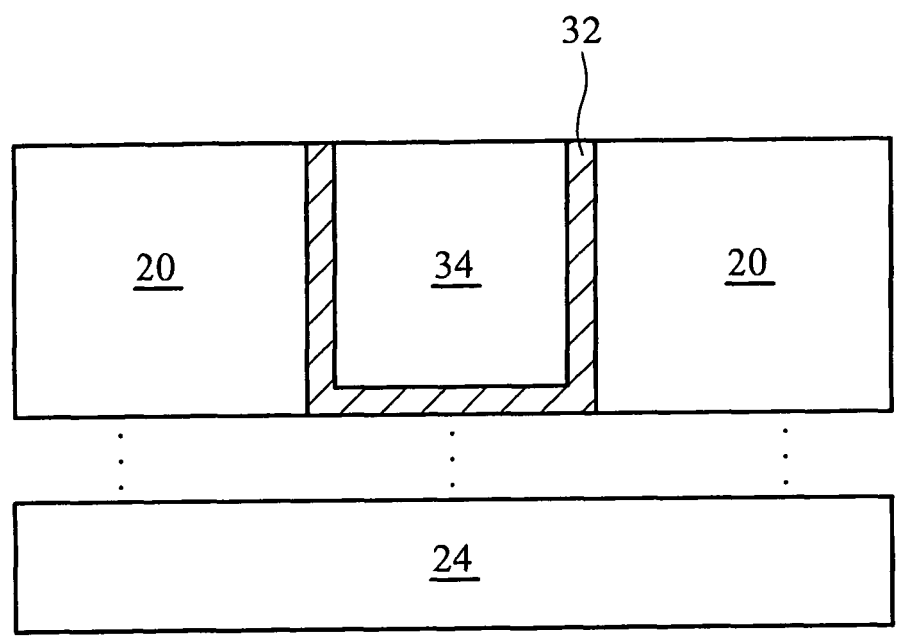

Referring to FIG. 4, a chemical mechanical polish (CMP) is performed to remove excess materials, and the top surface of the conductive material 30 is reduced until it is substantially level with a top surface of low-k dielectric layer 20. Diffusion barrier layer 32 and conductive line 34 are thus formed. Throughout the description, conductive line 34 is alternatively referred to as copper line 34 although it may include other conductive materials.

A treatment is then performed to improve the wetting ability of low-k dielectric layer 20. In the preferred embodiment, the treatment includes a plasma treatment. During the treatment, the hydrophobic surface of low-k dielectric layer 20 is converted to hydrophilic. This may result because the hydrophobic terminals, such as $CH_3$, on low-k dielectric layer 20 are replaced by hydrophilic terminals such as OH or NH. With a hydrophilic surface, in the subsequent plating process, low-k dielectric layer 20 achieves a uniform contact with the plating solution.

In a first embodiment, the treatment includes one treatment step. The process gases for the treatment preferably include He, $NH_3$, a combined gas of $N_2$ and $NH_3$, and/or other NH-based gases such as $NH_4OH$, and combinations thereof. In an exemplary embodiment, the treatment is performed using a process gas containing $NH_3$, and process conditions including a chamber pressure of about 1 mtorr to about 10 torr, a substrate temperature of about 250° C. and about 450° C., a process gas flow rate of between about 100 sccm and about 50000 sccm, and a treatment duration of about 15 seconds.

In a second embodiment, the treatment includes two steps: a first step for converting low-k dielectric layer 20 from hydrophobic to hydrophilic, and a second step for reducing metal oxides formed in the first step. During the first step, an oxygen-containing gas, such as $O_2$, $CO_2$, and combinations thereof, is used. Preferably, plasma is provided to assist the reaction. In an exemplary embodiment, the first step of the treatment is performed in an $O_2$-containing environment, and process conditions include a chamber pressure of about 1 mtorr to about 10 torr, a substrate temperature of about 250° C. and about 450° C., a process gas flow rate of between about 100 sccm and about 50000 sccm, and a duration of about 15 seconds.

In the first step of the treatment, a surface portion of copper line 34 (and possibly a surface portion of diffusion barrier layer 32) is oxidized, and metal oxides (not shown), such as copper oxide, are formed. The metal oxides need to be reduced before a cap layer is formed. In the second step, a further treatment reduces the metal oxides back to metals. Preferably, the process gases used in the second treatment include hydrogen-containing gases, for example, $H_2$, a combined gas of $N_2$ and $NH_3$, and other NH-based gases such as $NH_4OH$. In an exemplary embodiment, the second step of the treatment is performed in a chamber containing $H_2$, and process conditions include a chamber pressure of about 1 mtorr to about 10000 mtorr, a substrate temperature of about 250° C. and about 450° C., a process gas flow rate of between about 100 sccm and about 50000 sccm, and a duration of about 15 seconds.

Figure 5A:
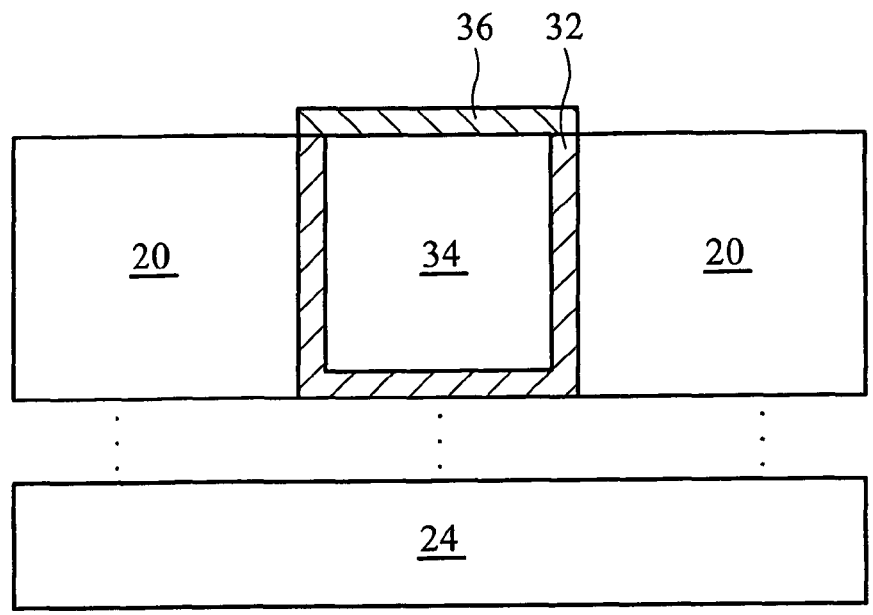

FIG. 5A illustrates a metal cap 36 formed selectively on conductive line 34 and diffusion barrier layer 32. Metal cap 36 preferably comprises materials such as cobalt, nickel, tungsten, molybdenum, silicon, zinc, chrome, boron, phosphorus, nitrogen, and combinations thereof. The preferred thickness of metal cap 36 is between about 10 Å and about 500 Å, and more preferably between about 100 Å and about 200 Å, although different thicknesses may be used. Preferably, metal cap 36 is substantially planar having a substantially planar top surface and a substantially planar bottom surface. In an embodiment, outer edges of metal cap 36 are vertically aligned to the outer edges of diffusion barrier layer 32, which is also a metal feature containing a metal.

In the preferred embodiment, metal cap 36 is formed by electroless-plating. In an embodiment of the present invention, the electroless-plating is preferably performed, for example, by using a plating solution containing desired metal ions such as cobalt ions, a complexing agent, a pH buffer, a pH adjusting agent and a reducing agent. Depending on the preferred composition of metal cap 36, the plating solution may further contain refractory (high-melting point) metals such as tungsten. The cobalt ions contained in the plating solution may be supplied from a cobalt salt, for example, cobalt sulfate, cobalt chloride or cobalt acetate. Other desired components preferred in metal cap 36, such as phosphorous, also may be included in the plating solution in the form of ions. The structure formed in the previously discussed steps is submerged in the plating solution, wherein the temperature of the plating solution is preferably in a range of between about 15° C. and about 250° C. In an exemplary embodiment, the plating duration is between about 10 seconds and about 300 seconds.

Figure 5B:
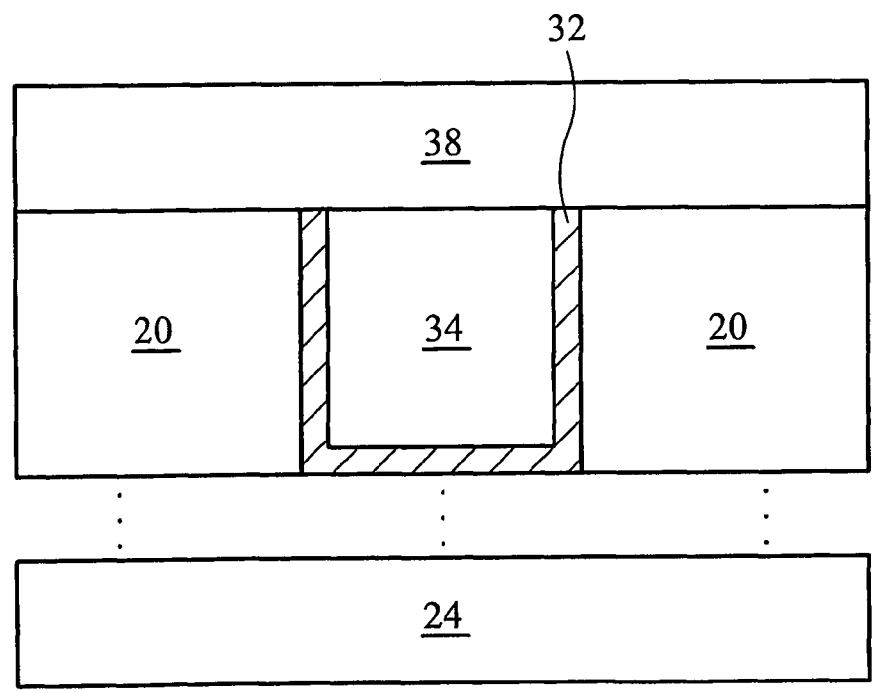

In the preferred embodiment, metal cap 36 is selectively formed only on copper line 34 and diffusion barrier layer 32, and not on low-k dielectric layer 20. This may be achieved by using a palladium catalyst, although a non-palladium catalyst can be used. Referring to FIG. 5B, since low-k dielectric layer 20, as treated, is hydrophilic, a more uniform contact between plating solution 38 and low-k dielectric layer 20 is formed. This in turn improves the contact between plating solution 38 and copper line 34. A better uniformity in the thickness of metal cap 36 is thus achieved.

In alternative embodiments, electro-plating may be performed. Also, metal cap 36 may include more than one layer. This may be achieved by further submerging the semiconductor wafer in additional plating solutions containing different ions. In yet other embodiments, if a cap layer is to be plated on both copper line 34 and low-k dielectric layer 20, the treatment described in the preceding paragraphs may also be performed, so that the resulting cap layer is more uniform across the entire region over low-k dielectric layer 20 and copper line 34.

Figure 6:
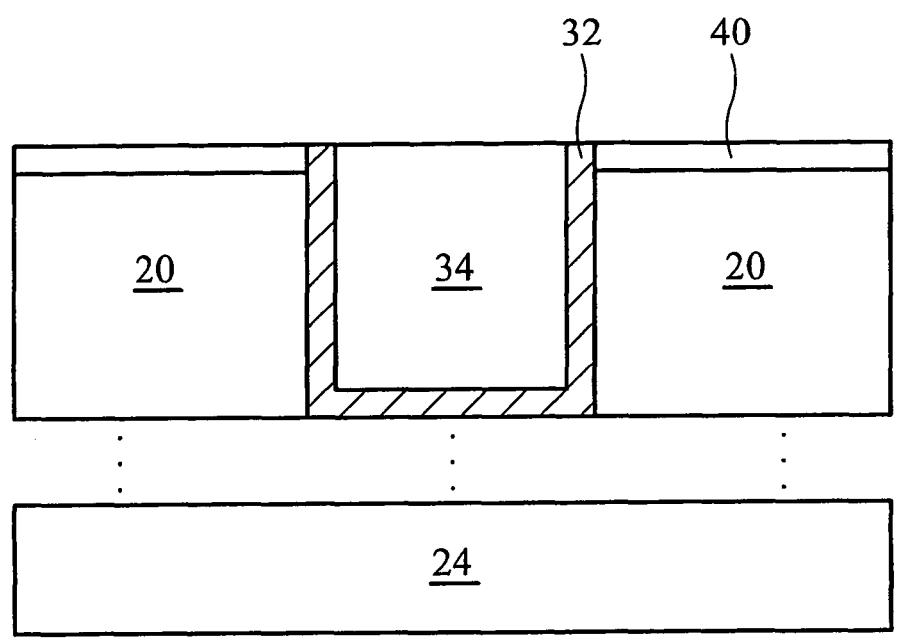
FIG. 6 illustrates a second embodiment of the present invention, wherein a chemical mechanical polish (CMP) stop layer is formed on a low-k dielectric layer.

FIG. 6 illustrates a cross-sectional view of a second embodiment of the present invention. In this embodiment, before the formation of the structure as shown in FIG. 2, a dielectric layer 40, which acts as a chemical mechanical polish (CMP) stop layer, is formed on dielectric layer 20. CMP stop layer 40 may comprise a material selected from SiCO, SiCN, and combinations thereof. The preferred formation method is plasma enhanced chemical vapor deposition (PECVD). However, other commonly used methods such as high-density plasma CVD (HDPCVD), atomic layer CVD (ALCVD), and the like can also be used. CMP stop layer 40 may remain after the CMP process, as is illustrated in FIG. 6. When CMP stop layer 40 has hydrophobic behavior, a treatment may be performed to convert the surface of CMP stop layer 40 to hydrophilic. Plating may then be performed using processes similar to what are shown in FIGS. 5A and 5B.

The embodiments of the present invention have the advantageous feature of improving the wetting ability of low-k dielectric layers; hence, the uniformity of the metal cap layers. Such an improvement, however, does not cause a degradation of the plating selectivity. Experiment results have revealed that no metal cap layer is formed on the low-k dielectric layers. Furthermore, the embodiments of the present invention cause no damage to low-k dielectric materials.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit, the method comprising:
providing a semiconductor substrate;
forming a metallization layer over the semiconductor substrate, wherein the metallization layer comprises a metal feature in a low-k dielectric layer and extending from a top surface of the low-k dielectric layer into the low-k dielectric layer;
after the step of forming the metallization layer, performing a treatment to form a hydrophilic top surface in a gaseous environment, wherein the treatment comprises a first treatment step to form the hydrophilic top surface for the low-k dielectric layer, wherein the first treatment step comprises an oxygen-containing process gas; and
after the step of performing the treatment, plating a cap layer on the metal feature in a solution, wherein the cap layer is substantially planar with a substantially planar top surface and a substantially planar bottom surface.

2. The method of claim 1, wherein the treatment comprises a plasma treatment.

3. The method of claim 1, wherein the treatment comprises a process gas selected from the group consisting essentially of He, a combined gas of $N_2$ and $NH_3$, $NH_3$, NH-containing gases, and combinations thereof.

4. The method of claim 1, wherein the treatment further comprises
a second treatment step to reduce an oxide layer formed in the first treatment step.

5. The method of claim 4, wherein the second treatment step comprises hydrogen-containing process gases.

6. The method of claim 5, wherein the hydrogen-containing process gases are selected from the group consisting essentially of $H_2$, a combined gas of $N_2$ and $NH_3$, NH-containing gases, and combinations thereof.

7. The method of claim 1, wherein the first treatment step comprises process gases selected from the group consisting essentially of $O_2$, $CO_2$, and combinations thereof.

8. The method of claim 1, wherein, during the treatment step, the top surface of the low-k dielectric layer is converted from hydrophobic to hydrophilic.

9. The method of claim 1, wherein regions on the low-k dielectric layer are substantially free from the cap layer.

10. The method of claim 1, wherein the step of plating the cap layer comprises electroless-plating.

11. The method of claim 1, wherein the metallization layer comprises a copper line, and wherein the cap layer is over and contacting the copper line.

12. The method of claim 11 further comprising a diffusion barrier layer between and adjoining the copper line and the low-k dielectric layer, wherein the diffusion barrier layer comprises a non-copper metal, and wherein the cap layer extends on a top edge of the diffusion barrier layer.

13. A method of forming an integrated circuit, the method comprising:
providing a semiconductor substrate;

forming a low-k dielectric layer over the semiconductor substrate;

forming an opening extending from a top surface of the low-k dielectric layer into the low-k dielectric layer;

filling a metal into the opening;

performing a chemical mechanical polish to remove portions of the metal over the top surface of the low-k dielectric layer;

after the step of performing the chemical mechanical polish, performing a treatment to convert the top surface of the low-k dielectric layer from hydrophobic to hydrophilic, wherein the treatment is performed using a method selected from the group consisting essentially of thermal treatment and plasma treatment, and wherein the treatment step comprises:

an oxygen-containing treatment step using an oxygen-containing process gas; and a reduction step after the oxygen-containing treatment step to reduce a metal oxide formed in the oxygen-containing treatment step; and selectively plating a metal cap on the metal, wherein the metal cap is substantially planar with a substantially planar top surface and a substantially planar bottom surface.

14. The method of claim 13, wherein, during the treatment, $CH_3$ terminals on the top surface of the low-k dielectric layer are replaced by OH terminals or NH terminals.

15. The method of claim 13, wherein the treatment comprises a plasma treatment.

16. The method of claim 13, wherein the reduction step is performed using a process gas selected from the group consisting essentially of He, a combined gas of $N_2$ and $NH_3$, $NH_3$, NH-containing gases, and combinations thereof.

17. The method of claim 13, wherein the step of selectively plating comprises electroless-plating.

18. The method of claim 13, wherein an entirety of the metal cap is over and contacting the metal.

19. The method of claim 18 further comprising a diffusion barrier layer between and adjoining the metal and the low-k dielectric layer, wherein the diffusion barrier layer comprises a different material than the metal, and wherein the metal cap extends on a top edge of the diffusion barrier layer.

* * * * *